United States Patent
Sato et al.

(10) Patent No.: US 6,543,521 B1
(45) Date of Patent: Apr. 8, 2003

(54) COOLING ELEMENT AND COOLING APPARATUS USING THE SAME

(75) Inventors: Kaoru Sato, Kumamoto (JP); Yasuhiro Fujiwara, Fukuoka (JP); Shinobu Kamizuru, Fukuoka (JP); Sumio Tate, Fukuoka (JP); Kazuhiko Sugimoto, Fukuoka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/678,794

(22) Filed: Oct. 4, 2000

(30) Foreign Application Priority Data

Oct. 4, 1999 (JP) ............................................ 11-282758

(51) Int. Cl.⁷ ................................................ H05K 7/20
(52) U.S. Cl. ...................................... 165/80.3; 361/704
(58) Field of Search ............................... 165/80.3, 185; 361/697, 704, 710

(56) References Cited

U.S. PATENT DOCUMENTS

| | | | |
|---|---|---|---|
| 4,369,838 A | * 1/1983 | Asanuma et al. ............ | 165/185 |
| 4,733,293 A | * 3/1988 | Gabuzda ..................... | 257/697 |
| 4,821,548 A | * 4/1989 | Shinozawa et al. ........... | 72/107 |
| 5,132,780 A | * 7/1992 | Higgins, III ................. | 257/722 |
| 5,304,846 A | * 4/1994 | Azar et al. .................. | 165/80.3 |
| 5,988,266 A | * 11/1999 | Smith et al. ................ | 165/78 |
| 6,075,703 A | * 6/2000 | Lee ........................... | 174/16.3 |
| 6,180,874 B1 | * 1/2001 | Brezina et al. .............. | 174/16.3 |
| 6,196,300 B1 | * 3/2001 | Checchetti .................. | 165/80.3 |
| 6,231,243 B1 | * 5/2001 | Zhang et al. ................ | 385/137 |

FOREIGN PATENT DOCUMENTS

| | | | | |
|---|---|---|---|---|
| JP | 57-193049 A | * 11/1982 | ........... | H01L/23/36 |
| JP | 9-298259 | 11/1997 | | |
| JP | 10-211723 A | * 8/1998 | ............ | B41J/2/335 |

OTHER PUBLICATIONS

Seri Lee, "Calculating spreading resistance in heat sinks", from Electronics Cooling, Jan. 1998, found at: http://www.electronics–cooling.com/Resources/EC_Articles/Jan98/article3.htm.*

* cited by examiner

Primary Examiner—Allen Flanigan
(74) Attorney, Agent, or Firm—McDermott, Will & Emery

(57) ABSTRACT

The cooling element of the present invention comprises a base section in contact with a heat producing element, and a heat dissipation section integrally formed with the base section. The cooling element of the present invention is constructed such that a ratio of T (a thickness of the base section) to L (a reference length, namely, a shortest width or an external diameter of the base section disposed right above the heat producing element) is within a range of not less than 0.14 and not more than 0.24. The cooling element of the present invention comprises a base section in contact with a heat producing element and a heat dissipation element integrally formed with the base section. The cooling element of the present invention is constructed such that a ratio of d (a length of the base section at around the center) to L2 (a longest length or an external diameter of said base section) is not less than 0.5.

2 Claims, 11 Drawing Sheets

Type 1

Type 2

US 6,543,521 B1

COOLING ELEMENT AND COOLING APPARATUS USING THE SAME

FIELD OF THE INVENTION

The present invention relates to a cooling apparatus. More particularly, the present invention relates to a cooling element (heat sink) which is used to cool heat producing semiconductor devices such as integrated circuits (IC), large scale integration (LSI), micro processing units (MPU), and to cooling apparatuses comprising heat sinks and blowers such as air cooling fans.

BACKGROUND OF THE INVENTION

Higher integration of electronic components and increasing frequencies of operation clocks have been increasing the heat produced by such components in recent years. Under such circumstances, maintaining actual operation temperatures of the electronic components within the range of operation guarantee temperatures has been becoming a critical issue in securing the normal functioning of the electronic components. Increases in integration and frequencies of the micro processing units (MPU) and other electronic components which emit considerable heat have been remarkable. Thus, dissipation of the heat produced by such electronic components has been becoming increasingly important in order to stabilize their operation and secure their operational life.

In general, a cooling apparatus which is used to dissipate heat produced by electronic components comprises a heat sink which expands the heat dissipation area and effectively transfers heat to a refrigerant such as air, and an air cooling fan which forcibly blows refrigerant such as air to the heatsink. These heat sinks comprise a base plate which spreads out the heat produced by the heat producing element and heat dissipation fins which transfer heat. Common types of heat sink include a plate-fin type and a pin-type fin in which, respectively many thin plates and pins are disposed on a base plate. These heatsinks are mainly constructed of materials of high thermal conductivity such as aluminum and copper, and produced by such methods as the extrusion molding method, the cold forging method, the die casting method, and the thin-plate lamination method.

Regarding the ways to mount the cooling apparatus onto an electronic component which emits considerable heat (hereinafter, heat producing element), it can be mounted either directly onto the heat producing element as illustrated in FIG. 10A, or indirectly by inserting a heat conducting plate between the heat producing element and the heat sink, as illustrated in FIG. 10B. The heat conducting plate is designed to conduct the heat produced by the heat producing element to the heatsink and to dissipate heat, and also to protect the heat producing element. The cooling mechanism of the cooling apparatus in use is described as follows: heat produced by the heat producing element shown in FIG. 10A, is conducted to heat dissipation fins 1 via a heat-conductive base section 2 made of materials of high thermal conductivity such as aluminum, and, over the surface of the heat dissipation fins 1, is transferred and dissipated into the air blown by a cooling fan 5, to be cooled.

In order to improve the performance of the cooling apparatus, heat is most desirably distributed evenly throughout the base plate, and dissipated through all of the heat dissipation fins. However, heat emitted from the heat producing element tends to be conducted predominantly to the heat dissipation fins disposed right above the heat producing element, and the amount of the heat conducted to the peripheral heat dissipation fins is relatively small. The reason for this is that the heat producing element is much smaller than the base plate, thus contact area between them is very limited. Consequently, the heat dissipation fins as a whole often fail to function effectively.

The most important point here is how to conduct heat emitted from the heat producing elements effectively to the heat dissipation fins over the broadest possible area, as mentioned previously. Some conventional methods focus on this point. For example, the Japanese Patent Application Laid Open Publication No. H09-298259 discloses a method of improving the cooling ability in which, in order to enhance the heat dissipation effect of the base plate, as shown in FIG. 11, the entire surface of the base section on the heat producing element side is covered with a metallic material such as copper whose thermal conductivity is at least higher than that of aluminum.

In the case of the forced air cooling system, in which outside air is forcibly blown onto the surface of the fins 1 by a fan, the heat dissipation ability of the fins 1 is determined by the amount of the heat transferred to the influent air from the surface of the fins 1. In other words, the heat dissipation ability is determined by the volume of air exhausted outside from the heat sink per unit of time. Simply put, it is necessary to form the fins 1 over an area as broad as possible and provide a large amount of air. However, as previously mentioned, in the case of currently available electronic apparatuses, the proportion of the heat sink to the apparatus as a whole limits the available space. Thus, the applicable number of the fins, and the size and capability of the fans are inevitably limited, hampering the achievement of a high cooling ability. In some cases, conventional heat sinks are produced in such a manner that the greatest possible number of fins 1 for each unit area are formed on the base 2 in order to enhance the heat dissipation ability by increasing the heat dissipation area. However, in this case, as the number of the fins per unit area increases, the space between the fins becomes narrower, thus increasing fluid resistance to the air brought in by the fan. As a result, the absolute volume of air flow decreases, lowering the heat dissipation ability per unit of time. As such, the cooling ability is determined by the balance between the level of an increase in the heat dissipation area and a decrease in the air flow. Thus, mere increase in the surface area does not lead to an improvement in the cooling ability.

Therefore, in order to achieve a high ability while reducing the size and weight as much as possible, it is essential to improve the performance of the base 2 which conducts heat to the fins 1.

The above description is mainly focused on the cooling elements and cooling apparatus used for the electronic components, however, the same theory can be applied to other general heat producing elements.

The present invention aims at providing cooling elements and cooling apparatus using the same which are effectively used for cooling heat producing elements in general.

SUMMARY OF THE INVENTION

The object of the present invention is to provide a smaller and lighter heat sink having a higher heat dissipation ability and a cooling apparatus using such heat sink.

The cooling element of the present invention comprises a base section which is in contact with a heat producing element to be cooled, and a heat dissipation section composed of heat dissipation fins, which is integrally formed with the base section. The cooling element is constructed such that the ratio of T (thickness of the base section) to L (reference length, namely, either the shortest width of the base section right above the heat producing element or its external diameter) is within the range of not less than 0.14 and not more than 0.24.

Another cooling element of the present invention comprises a base section which is in contact with a heat producing element to be cooled, and a heat dissipation section composed of heat dissipation fins, which is integrally formed with the base section. This cooling element is constructed such that the ratio of d (length of a face of the base section, which faces the heat producing element) to L2 (reference length of the base section, namely, either the length of the longest length of the base section or its external diameter) is not less than 0.5.

The cooling apparatus of the present invention comprises the cooling element of the present invention and an air blowing device.

With the construction mentioned above, the present invention aims at providing a cooling element and a cooling apparatus using the same which achieve a higher heat dissipation ability while reducing the size and weight.

Advantages of the present invention will become apparent to those skilled in the art from the following detailed description of the exemplary embodiments of the present invention. The invention itself can better be understood by reference to the following detailed description and the accompanying drawings.

BRIEF DESCRIPTION OF THE DRAWINGS

In the various figures, identical or similar elements, structures and operations are similarly numbered. Any differences between similarly numbered elements, structures and operations in the various figures will be apparent to the artisan from the figures or from the following description.

DETAILED DESCRIPTION OF THE PREFERRED EMBODIMENTS

The preferred embodiments of the present invention are described hereinafter with reference to the accompanying drawings.

I. The First Preferred Embodiment

Figure 1A:
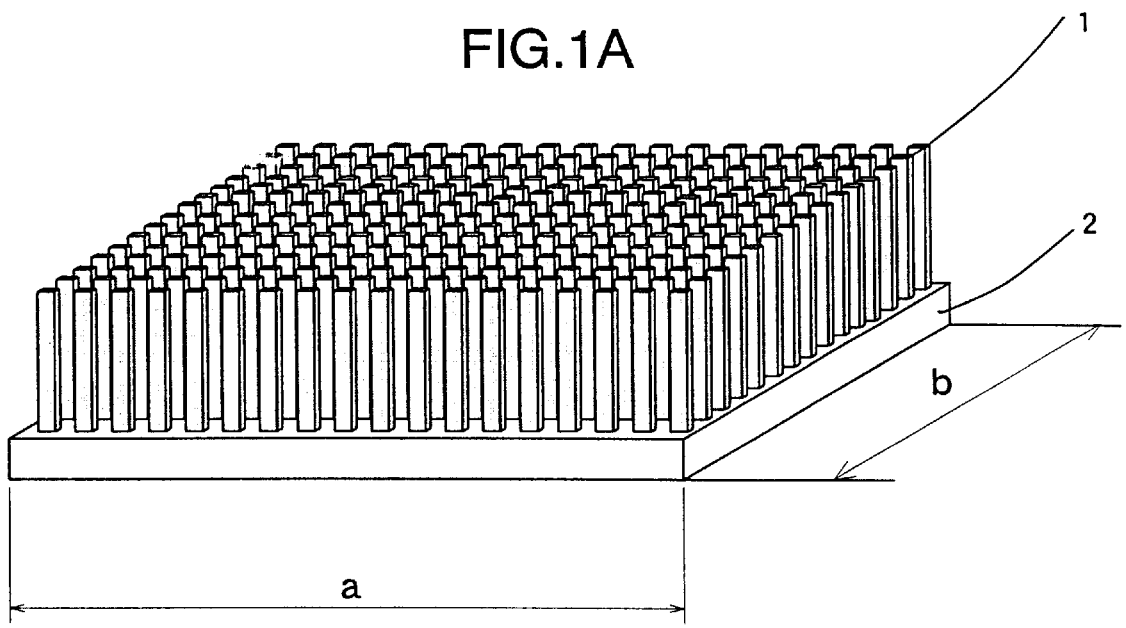
FIG. 1A shows a perspective view of a heatsink whose base section is rectangular in accordance with the present invention.
Figure 1B:
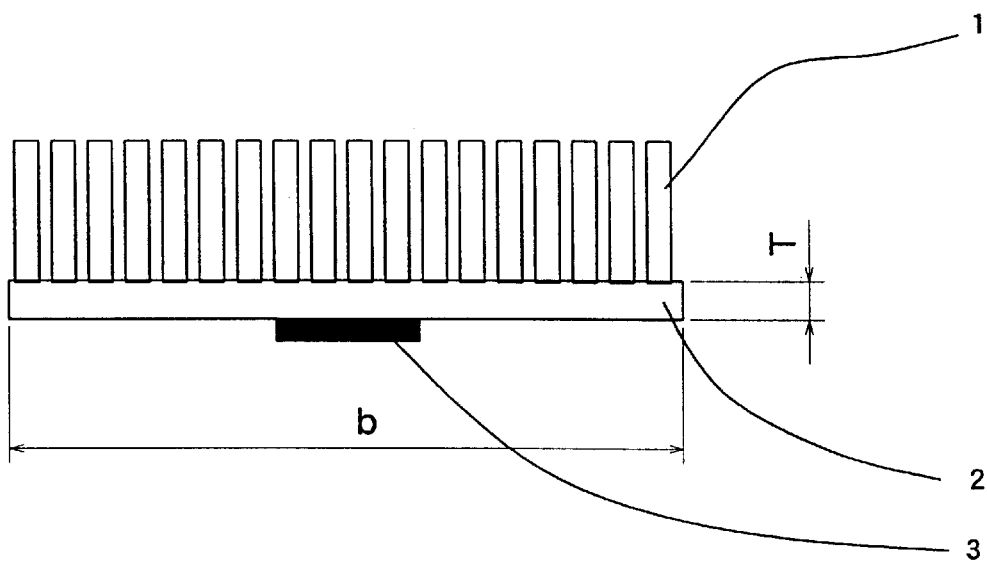
FIG. 1B shows a sectional view of the rectangular heatsink sectioned right above the heat producing element in accordance with the present invention.
Figure 2A:
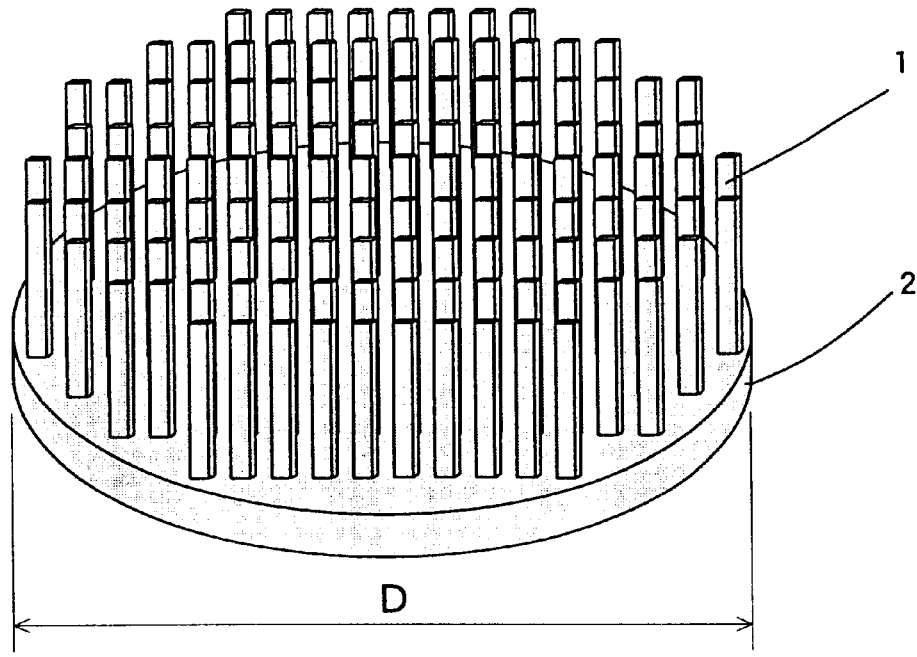
FIG. 2A shows a perspective view of a heatsink whose base section is circular in accordance with the present invention.
Figure 2B:
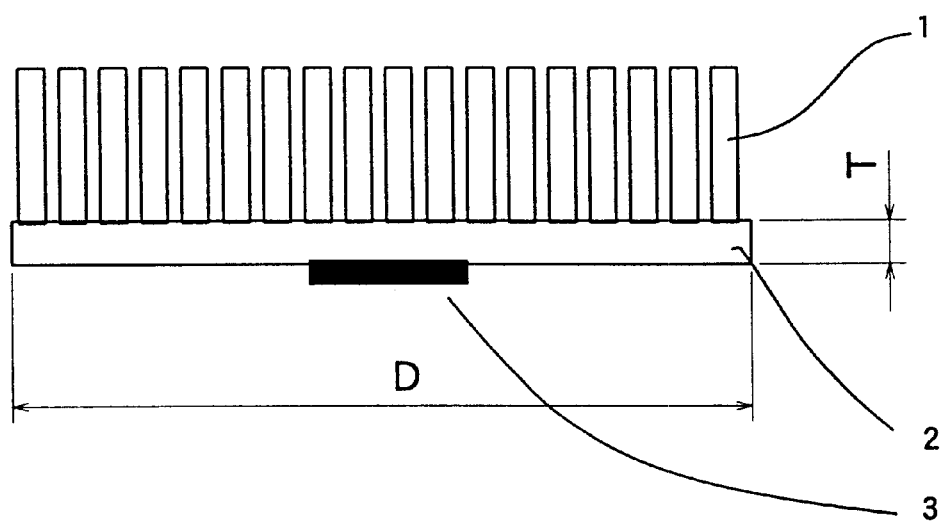
FIG. 2B shows a sectional view of the circular heatsink sectioned right above the heat producing element in accordance with the present invention.
Figure 3:
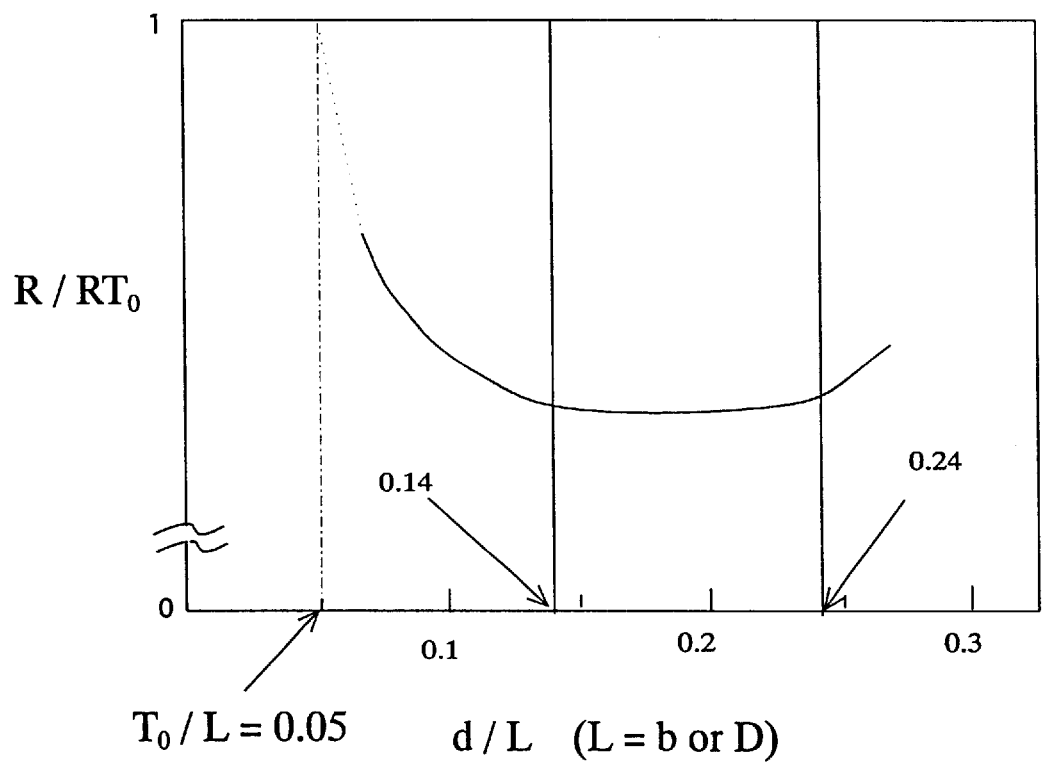
FIG. 3 is a graph showing the effects that of the ratio of T (the thickness of the base section) to L (the reference length of the base section) on the ability of the heat sink in accordance with the present invention.

FIG. 1A shows a perspective view of a cooling apparatus in which the base of the heat sink is rectangular in accordance with a first preferred embodiment of the present invention. FIG. 1B is a sectional view from a view point of b, the shorter side of the base. FIGS. 2A and 2B are respectively a perspective view and a sectional view of a heat sink of a cooling apparatus whose base is circular. FIG. 3 is a graph in which the vertical axis represents the ratio of the cooling ability R/RTo (hereinafter, normalized thermal resistance), the horizontal axis shows the ratio of T (the thickness of the base) to L (the reference length, namely either b, the shortest width or D, the external diameter of the base section disposed right above the heat producing element). Hereinafter, the ratio of T to L is called the "ratio of the sizes".

The ratio of the cooling ability R/RTo is described later in detail.

In FIGS. 1A and 1B, a single or a plurality of fins 1 is disposed. The base 2 is disposed on a heat dissipation section 1. A heat producing element 3 is disposed on the face of the base 2 other than the face with the fins 1 disposed thereon. In FIGS. 1A and 1B, the heat sink is composed of the fins 1 and the base 2. The heat producing element 3 is an electronic component which produces heat such as semiconductor devices including IC, LSI and MPU and transistors.

When the base 2 is a quadrangle plate, positioning becomes easier and reduces waste of materials. Especially, when the base 2 is a rectangular plate, it is even more preferable in terms of mountability and dissipation of heat. As shown in FIG. 2A, the base 2 can be a disk.

The base 2 has the fins 1 disposed on one face thereof. Preferably the fins 1 are disposed on the face other than the face in contact with the heat producing element 3. Some of the fins 1 can also be disposed on part of the side face of the base 2 or the face of the base 2 in contact with the heat producing element 3.

It is preferable to chamfer the corners of the base 2 to prevent undesirable material caused by chipping. If the corners of the base 2 are sharp, they can possibly damage other components when coming into contact with the component while the heat sink is being mounted. Further, if the undesirable material is produced and falls on wiring, it may cause a short circuit, resulting in malfunction of the electronic devices.

The base 2 and the fins 1 can be formed integrally, or the fins 1 can be bonded to the base 2 as a separate component with adhesives. It is also possible to form holes on the base 2 and press fit the fins 1 into those holes.

When the base 2 and the fins 1 are integrally formed, the productivity improves. In addition, the heat dissipation effect is improved, since no parts which cause resistance to the conductivity of heat exists in between the base 2 and the fins 1. When the fins 1 are fixed to the base 2 with adhesives or by press-fitting, each of the base 2 and the fins 1 can be made with the most suitable materials, thereby facilitating design of the heat sink.

For the construction of the fins 1, a square pole as shown in FIG. 1A, a cylinder, a polygonal pole, a elliptic cylinder and the like can be used. By forming the fins 1 to have a shape of square pole, the mounting density of the fins 1 can be increased, thereby improving the heat dissipation.

In this embodiment, thickness of the fins 1 is set approximately the same. However, the fins 1 can be designed such that they have a taper in which either the thickest or thinnest part is fixed to the base 2. The fins 1 can also be designed so that each of them has the thinnest or the thickest part around its center.

Chamfering of the corners of the fins 1 prevents generation of the undesirable material caused by chipping as previously mentioned.

In this embodiment, surfaces of the fins 1 are not specially processed, however, if smaller fins are disposed on the fins 1, the heat dissipation effect can be promoted further.

It is preferable to dispose the fins 1 at regular intervals in terms of heat dissipation and productivity as shown in FIG. 1A. It is possible to partially change the density of the fins 1, for example, with the highest density of disposition being at and around the center of the base 2 and the lowest around the peripheries, and vise versa. Selection of these different constructions can be made case by case, considering the shape of the heat producing element 3 or conditions for use. Appropriate selection will achieve an optimum cooling ability for each shape of the heat producing element 3, thus improving the cooling ability.

In this embodiment, the height of all the fins 1 are the same so that the fan can be securely mounted, however, the height of the fins 1 can be changed in some parts. The height of the fins 1 can be designed for each particular case, considering the shape of the heat producing element 3 or conditions for use. Appropriate designing will achieve an optimum cooling ability for each shape of the heat producing element 3, thus improving the cooling ability.

The pin-type fins 1 are used in this embodiment, however, plate-type fins are also applicable.

As for the materials, the heatsinks are preferably composed of materials with a thermal conductivity at 100° C. of 100 W/(m·K) or higher. Such materials can be selected from zinc, aluminum, brass, gold, silver, tungstenite, copper, beryllium, magnesium, and molybdenum (hereinafter, material group). These materials can be used in their pure form or in an alloy form. In the latter case it is possible to either select a plurality of materials from the above-mentioned material group or select at least one from the material group and combine it with materials not included in the material group. In this embodiment, pure aluminum or an aluminum alloy composed of aluminum and at least one other material selected from the material group are used considering the easiness of processing and cost.

When the base 2 and the fins 1 are integrally formed as mentioned previously, needless to say, the same materials are preferably used for both base 2 and fins 1 for manufacturing reasons. Conversely, when the base 2 and the fins 1 are separately produced and then bonded together, either the same or different materials can be used for them.

The following is the description of the relationship between the length and the diameter of the base 2 and the thickness of the base 2 shown in FIGS. 1A and 2A.

"RTo" is defined as a basic heat resistance. The basic heat resistance is the amount of the heat resistance when the ratio of the sizes To/L (the basic thickness of the base to the reference length, namely, To/b or To/D) is 0.05, or 5%. Hereinafter, the ability of the heat sink is evaluated, in comparison with the basic heat resistance.

In general, if temperature of a material is increased $\Delta t$ (°K.), when the heat quantity Q (W) is applied, the heat resistance R is a coefficient obtained in the formula shown below (formula 1).

$$R = \Delta t / Q \quad (1)$$

The reference length L is described hereinafter. In the case of the heat sink shown in FIG. 1A, the shortest width of the base 2 on which the heat producing element 3 is mounted is b. Thus, when the base 2 is quadrangle as shown in FIG. 1A, L=b. In the case of FIG. 2A, since the base 2 is a disc, the shortest width equals the external diameter, thus L=D. Basically, the heat producing element 3 is mounted approximately the center of the base 2 so that it can be cooled most effectively. L can be defined as the shortest width or the external diameter across the center of the base. When the base 2 is oval, the shorter diameter is L providing that the heat producing element 3 is mounted at the center of the base 2. When the base 2 is square or other regular polygons, providing that the heat producing element 3 is mounted on the center of the base 2, the shortest distance from side to side across the heat producing element 3 is L. Further, when the shape of the external diameter of the base 2 is complex, needless to say, the shortest width is L.

The normalized heat resistance R/RTo is calculated such that the heat resistance R which is a value obtained by setting the reference length L constant and changing the thickness T of the base, is divided by RTo to normalize.

As FIG. 3 shows, the normalized heat resistance R/RTo is a smallest value within the range of the ratio of the sizes not less than 0.14 and not more than 0.24. Within the range of the ratio of the sizes 0.05–0.14, along with the improvement in the cooling ability provided by the increase in the thickness of the base 2, T. the heat resistance R drops steeply. Within this range, increases in the thickness of the base 2 promote the heat dissipation effect, conducting heat to the fins 1 disposed not only in the vicinity of the heat producing element but also around the peripheries, thereby enhancing the cooling ability of the heat sink as a whole. Up to the range of the ratio of the sizes not less than 0.14 and not more than 0.24, almost no change in the heat resistance is observed. The reason for this is that, in this range, the heat dissipation effect associated with the increase in the thickness of the base 2 is more or less offset by the increase in the heat resistance in the direction of the thickness of the base 2 itself. When the ratio of the sizes is not less than 0.24, the heat resistance starts to gradually increase. In this range, the increase in the heat resistance of the base 2 itself exceeds the improvement in the heat dissipation effect brought about by the increase in its thickness, as a result, the heat resistance increases.

Therefore, when the ratio of the thickness of the base 2 T to the reference length L (namely T/b or T/D) is within the range of not less than 0.14 and not more than 0.24, the highest cooling ability is achieved. When the ratio of the sizes is within the range of not less than 0.14 and not more than 0.24, desirably, T (the thickness of the base 2) is set so as to the ratio of the sizes is close to 0.14 to maintain relatively lighter weight.

According to the present invention, providing the base 2 is made with single material, when the ratio of the sizes of T/L (the thickness of the base 2 to the ratio of the reference length of the heat sink) is within the range of not less than 0.14 and not more than 0.24, the minimum level of the heat resistance in relation to any surface area of the fin 1 can be obtained. In other words, if the value of T, the thickness of the base 2, against L, the reference length of the base 2 which is specified in a limited space of a cooling equipment, is determined in a manner that the ratio of T/L becomes within the range of 0.14–0.24, the maximum heat dissipation ability can be obtained for the construction of the fins 1 at the time.

II. The Second Preferred Embodiment

Figure 4A:
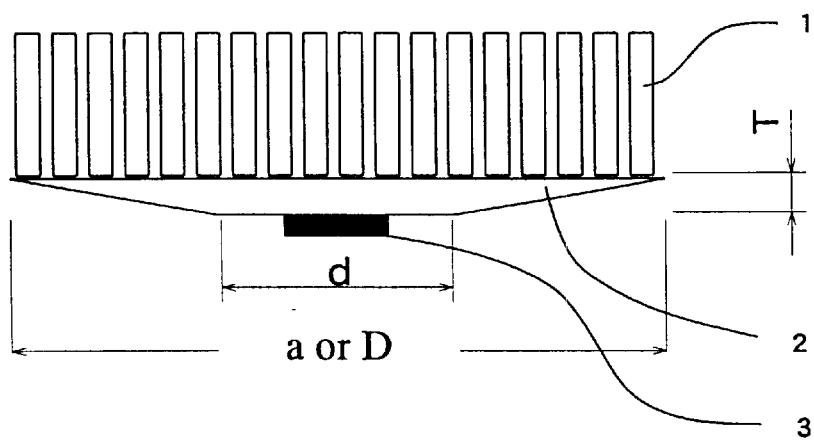
FIG. 4A shows a sectional view of another heat sink of the present invention.
Figure 4B:
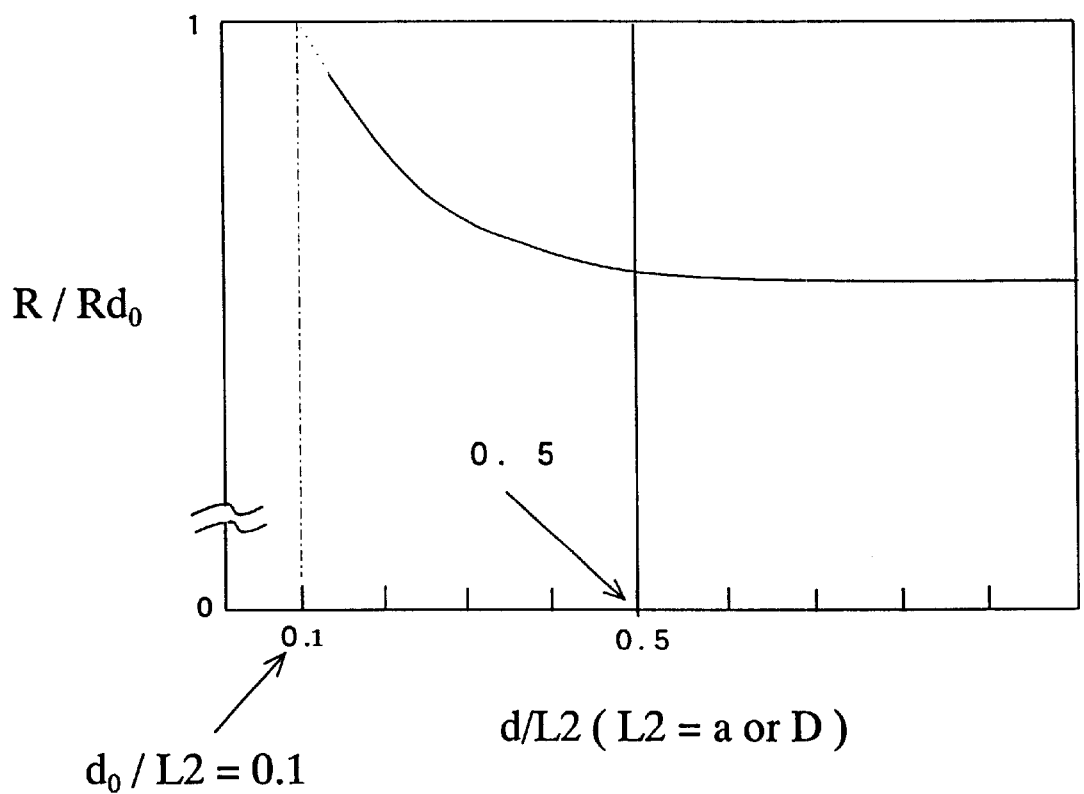
FIG. 4B is a graph showing the effects that the ratio of d (the length of the face of the base section in contact with the heat producing element) to L2 (the reference length of the base section) has on the ability of the heat sink in accordance with the present invention.
Figure 5A:
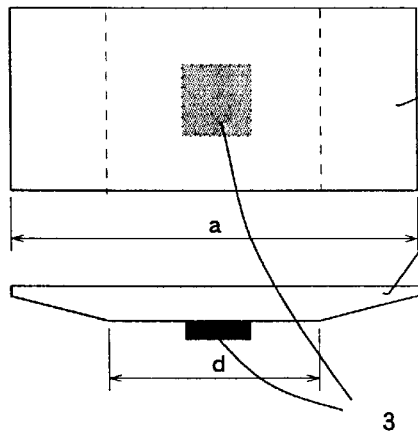
FIGS. 5A, 5B and 5C are diagrams showing that the shapes of the bases in contact with the heat producing element change according to the different shapes of the bases (rectangle, square, and circle) on the heat producing element side in accordance with the present invention.
Figure 5A:
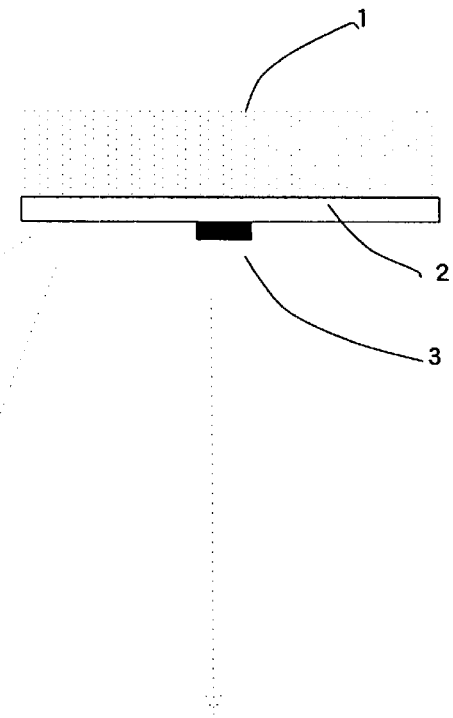
Figure 5B:
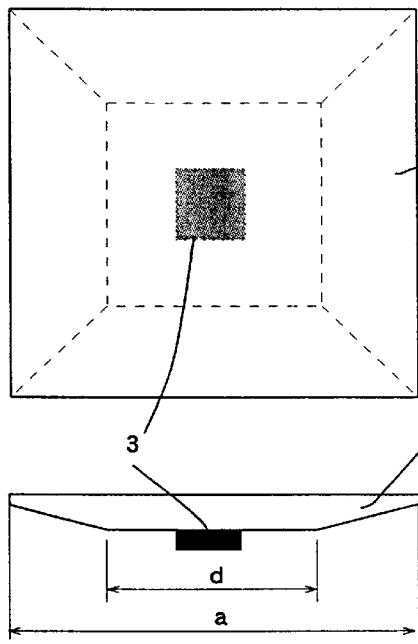
Figure 5C:
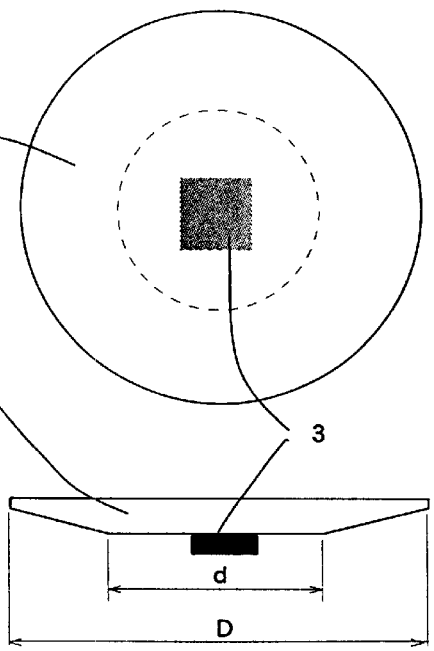

FIG. 4A shows a side view of a heat sink of a cooling apparatus in accordance with a second preferred embodiment of the present invention. FIG. 4B is a graph showing the relationship between 1) the ratio of the sizes d/a (d is the size of the base section in contact with the heat producing element 3, a is the largest width of the base section) and 2) the normalized heat resistance R/Rdo. FIGS. 5A, 5B and 5C show front and side views of the base sections of the heat sink which have different shapes respectively rectangle, square, and circle.

The difference of this embodiment from the embodiment shown in FIGS. 1, 2 and 3, is that the part of the base 2 on which the heat producing element is mounted is thicker than the rest of the base 2. As shown in FIGS. 4 and 5, the thicker part can be tapered or can protrude vertically.

In FIG. 4B, the horizontal axis is the ratio of the sizes d/L2 obtained by changing d (the length of the face of the base 2 in contact with the heat producing element) against the value of the reference length L2 (either a, the maximum width of the base 2 in FIG. 1 or D, the external diameter of the base 2 in FIG. 2), and the vertical axis is the ratio of the cooling ability shown as the normalized thermal resistance R/Rdo.

The basic heat resistance Rdo in this embodiment is the amount of the heat resistance obtained when the ratio of the sizes do/L2 (do is the basic size of the face of the base 2 on the heat producing element side, and L2 is the reference length of the base 2, namely either a or D) is 0.1, or 10%. The normalized heat resistance R/Rdo is obtained such that the heat resistance R, a value calculated by setting the reference length L2 constant and changing the size d of the base 2, is divided by Rdo to normalize.

As shown in FIG. 4B, the minimum value of R/Rdo is obtained when the ratio of the sizes is not less than 0.5. Within the range of the ratio of the sizes 0.1–0.5, along with the improvement in the cooling ability provided by the increase in d, the size of the face of the base 2 on the heat producing element side, the heat resistance R drops gradually. Within this range, the cooling ability of the heat sink as a whole improves since the heat dissipation effect is promoted by the increase in the size d of the face on the heat producing element side. In the range of the ratio of the sizes not less than 0.5, almost no change is observed in R/Rdo. Within this range, the heat dissipation effect associated with the increase in the size d of the base 2 reaches its limit, terminating the improvement in the cooling ability. As a result, no change occurs in the heat resistance in this range.

Therefore, when the ratio of the sizes d/L2 (L2=a or D) is set to be not less than 0.5, the highest cooling ability is achieved. When the cooling ability is the same and the ratio of the sizes is not less than 0.5, desirably, the size d is set in a manner that the lightest possible weight is achieved while maintaining the ratio of the sizes close to 0.5. Preferably, the ratio of the sizes is not more than 0.8.

III. The Third Preferred Embodiment

Figure 6A:
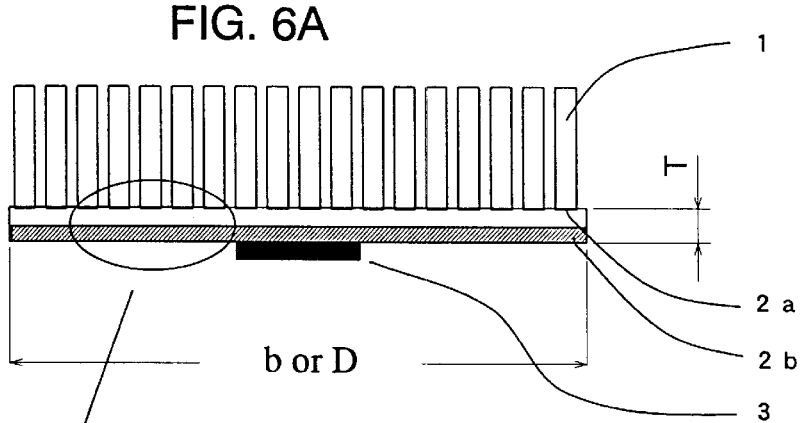
FIG. 6A shows a sectional view of another heat sink of the present invention.
Figure 6B:
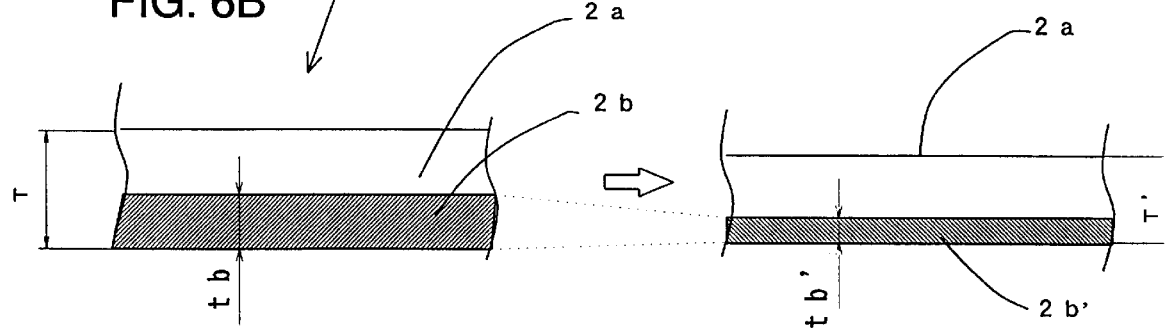
FIG. 6B shows an enlarged view of the another heat sink of the present invention.
Figure 6C:
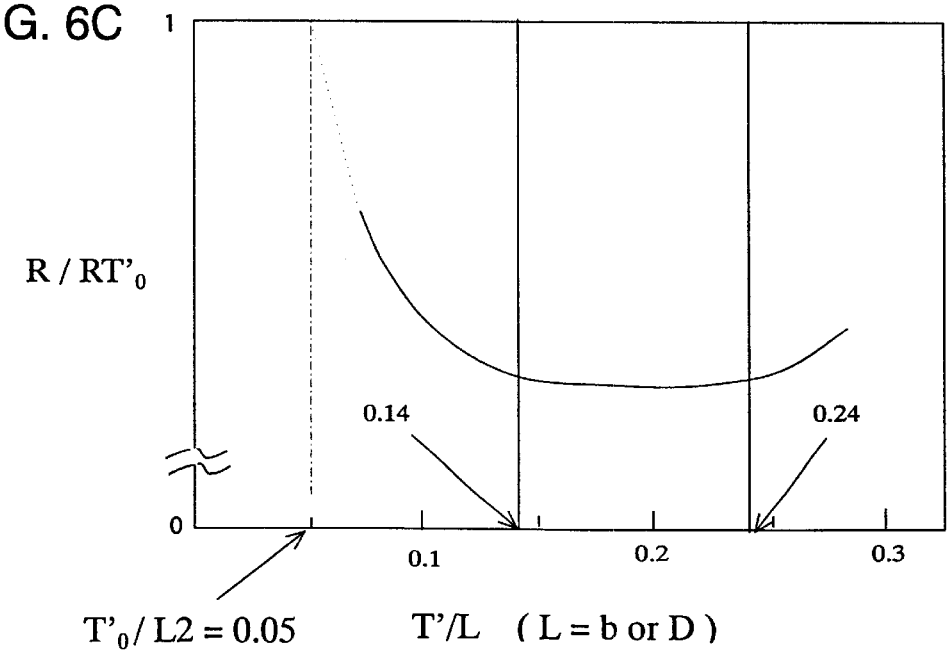
FIG. 6C is a graph showing the effects that the ratio of T' (a converted thickness of the base) to L (reference length of a composite base section) has on the ability of the heat sink in accordance with the present invention.

In FIG. 6A, the base section of the third preferred embodiment of the present invention is made with two kinds of materials. Apart from this point, the heat sink is constructed in the same manner as FIGS. 1A and 2A. FIG. 6C is a graph similar to the graphs prepared for the embodiments illustrated in FIGS. 1A and 2A. In FIG. 6C, the horizontal axis is the ratio of the sizes T'/L, namely T'/b or T'/D (L is the reference length which is either b, the shortest width of the base section right above the heat producing element, or D, the external diameter of the base section) obtained by setting the value of L constant and changing the converted thickness T' of the base, the vertical axis is the cooling ability shown as the ratio of the normalized heat resistance R/RT'o. In other words, this graph shows the relationship of R/RT'o and T'/L.

The difference between this embodiment and the first preferred embodiment is that the base 2 is constructed by laminating a plurality of heat conducting plates. More specifically, the base 2 is constructed by laminating heat conducting plates 2a and 2b made with different materials. In this embodiment, two heat conducting plates are laminated, however, three or more heat conducting plates can be laminated.

The converted thickness T' of the base is a value calculated with the formula (2). It is the addition of the thickness tb' obtained by converting the thickness of the heat conducting plate 2b to that of a heat conducting plate 2a to ta the thickness of 2a.

$$T' = ta + tb' \lambda a / \lambda b \qquad (2)$$

where, $\lambda a$ and $\lambda b$ are the thermal conductivity of the materials a and b.

In this embodiment, the basic heat resistance RT'o in FIG. 6C is defined as the heat resistance obtained when the ratio of the sizes, the basic thickness of the base 2, T'o to the reference length, L, namely, T'o/b or T'o/D, is 0.05 or 5%. The normalized heat resistance R/RT'o is calculated such that the heat resistance R, obtained when setting the reference length L (the shortest width of the base 2 or the external diameter of the base 2) constant and changing the converted thickness T' of the base 2, is divided by RT'o to normalize. As FIG. 6C suggests, the relationship between the normalized heat resistance R/RT'o and the ratio of the sizes is the same as that of FIG. 3, and the optimum cooling ability can be obtained within the range of not less than 0.14 and not more than 0.24. It also suggests that, desirably, the converted thickness of the base 2, T' be set in a manner that the ratio of the sizes is close to 0.14 while maintaining relatively lighter weight.

Further, the same theory can be applied to the base 2 made with a greater number of different materials. For example, when the thermal conductivity and thickness of each material are respectively $\lambda 1, \lambda 2 \ldots \lambda n$ and $t1, t2 \ldots tn$, the converted total thickness T' can be calculated with the formula (3) defined below:

$$T'=t1+t2*\lambda 1/\lambda 2+ \ldots +tn*\lambda 1/\lambda n \quad (3)$$

In this case, when the reference length L is defined as the shortest width or the external diameter of the base 2 right above the heat producing element 3, by setting the converted total thickness of the base section, T' and the reference length, L in such a manner that the ratio of T'/L is within the range of not less than 0.14 and not more than 0.24, it is possible to obtain a composite cooling apparatus which enjoys a significantly high cooling ability, which is difficult to obtain with the base 2 made with a single material.

The converted thickness of the base is briefly described again below, with an example in which two different materials are used In this case the thermal conductivity is defined as $\lambda a$ is less than $\lambda b$. When the converted thickness of the base which is made with two kinds of materials is set as T', T' is equal to ta+tb'. Providing the heat resistance R is a ratio of the thickness T to the thermal conductivity "$\lambda$", as shown in the formula (4), and the heat resistance before and after conversion, namely, Rb and Rb' are the same, tb can be converted to tb' as shown in the formula (5). This is the same as the second term in the formula (2), and can be applied to a base using greater number of materials. In other words, the converted total thickness T' is the addition of the converted thickness of each material.

$$Q=\Delta t/R=\Delta t*\lambda/T \quad (4)$$

$$R=T/\lambda$$

$$Rb=Rb'$$

$$tb/\lambda b=tb'/\lambda a$$

$$tb'=tb*\lambda a/\lambda b \quad (5)$$

IV. The Fourth Preferred Embodiment

Figure 7A:
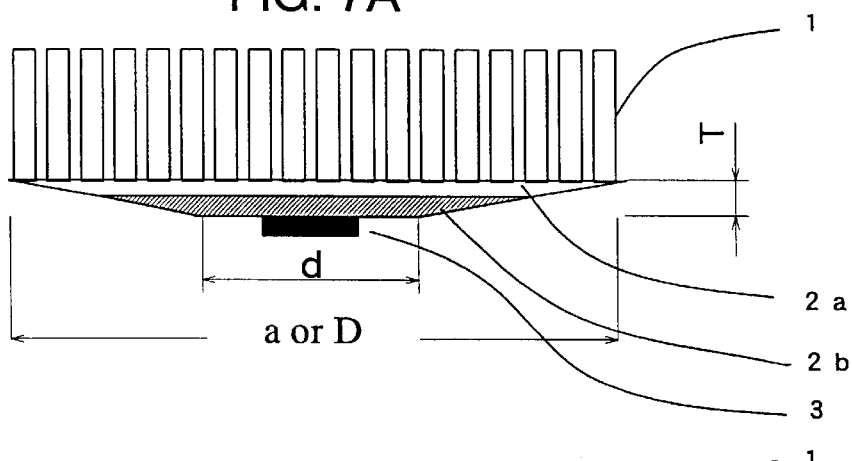
FIGS. 7A and 7B show sectional views of a heat sink using a composite base section in accordance with the present invention.
Figure 7B:
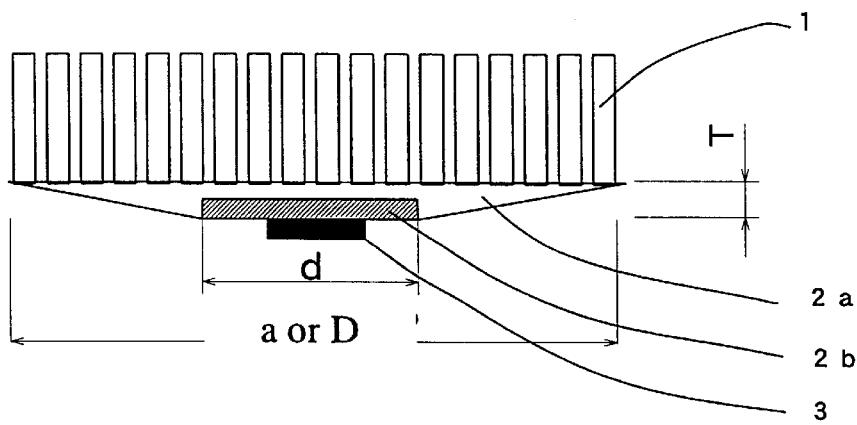
Figure 7C:
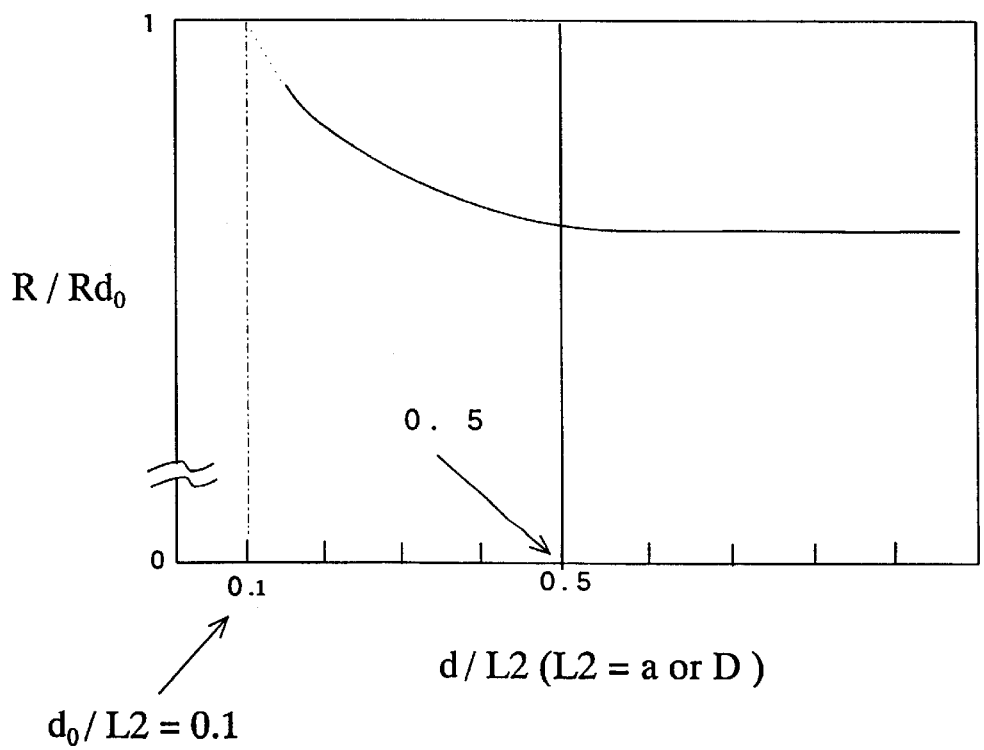
FIG. 7C is a graph showing the effects that the ratio of d (the length of the face of the composite base section in contact with the heat producing element) to L2 (the reference length of the base section) has on the ability of the heat sink in accordance with the present invention.

FIG. 7A shows a sectional view of a heat sink of a cooling apparatus whose base section is made with two kinds of materials in accordance with a fourth preferred embodiment of the present invention. FIG. 7B shows a sectional view of another heat sink of a cooling apparatus of this embodiment. FIG. 7C is a graph prepared for both FIG. 7A and FIG. 7B. FIG. 7C shows the relationship between 1) the ratio of d/L2 obtained by changing d (the size of the base section in contact with the heat producing element 3) against a fixed value of L2 (either the largest width a or the external diameter D of the base section), and 2) the normalized heat resistance R/Rdo.

The difference of this embodiment from the previous embodiments, is that base 2 has a thicker part formed with a taper or protruded vertically with a different material.

In FIG. 7A, the face of the base 2 on the heat producing element 3 side is carved so that the size of the face becomes d. Similarly, in FIG. 7B, the face of the base 2 on the heat producing element 3 side is also carved, and in addition, a second material of the same size as d is embedded in the recess. As FIG. 7C shows, the heat conduction properties are the same in the two different constructions in which a heat conducting plate 2b is either bonded onto or embedded in the heat conducting plate 2a, when the thickness ta and tb of the two materials composing the base 2 and the total thickness T are the same as well as the sizes of the face of the base 2 on the heat producing element 3 side.

Similar to FIG. 4B, Rdo is defined as the basic heat resistance which is the amount of the heat resistance obtained when the ratio of the sizes do/L2 (do is the basic size of the face of the base 2 on the heat producing element 3 side, and L2 is either the largest width a or the external diameter D of the base 2) is 0.1, or 10%. Similarly, the normalized heat resistance R/Rdo is calculated such that the heat resistance R, which is a value obtained by setting the reference length L2 constant and changing the size d of the base 2 on the heat producing element side, is divided by Rdo to normalize.

As shown in FIG. 7C, the minimum value of the normalized heat resistance R/Rdo is obtained when the ratio of the sizes is not less than 0.5. Within the range of the ratio of the sizes 0.1–0.5, the heat resistance R drops gradually, and when the ratio of the sizes is not less than 0.5, almost no change is observed in R/Rdo. This tendency is also the case with the embodiment in which the base is made with a single material shown in FIG. 4B.

Therefore, when the ratio of the sizes d/L2 (L2=a or D) is not less than 0.5, the highest cooling ability is obtained. When the ratio of the sizes is not less than 0.5, further improvement in the cooling ability is hardly obtained, therefore, in order to make the weight as light as possible, desirably, the size d should be set such that the ratio of the sizes becomes close to 0.5. As thus far described, the ratio of the sizes should be not less than 0.5 both in the cases when the base is made with a single material and when two or more materials are used.

V. The Fifth Preferred Embodiment

Figure 8A:
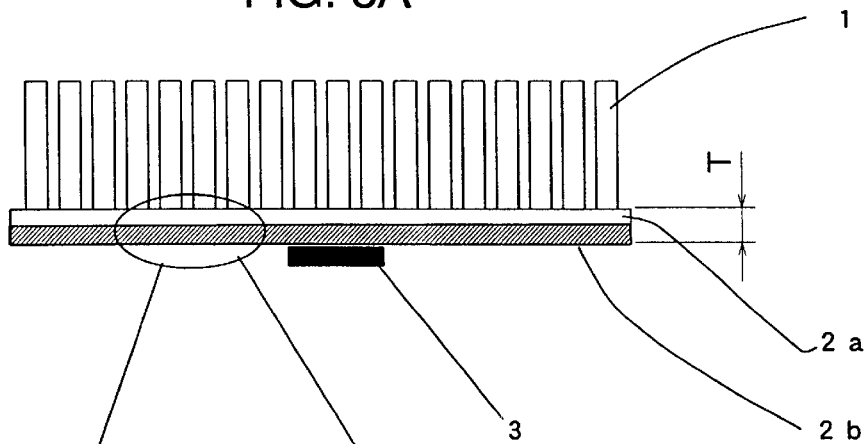
FIG. 8A shows a sectional view of the composite base comprising a plurality of materials right above the heat producing element in accordance with the present invention.
Figure 8B:
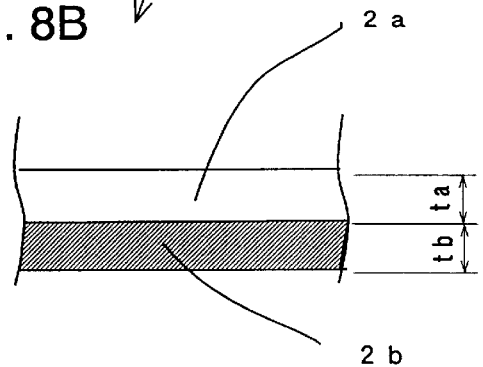
FIG. 8B shows an enlarged view of a cross section of the composite base comprising a plurality of materials, in which the face on the heat producing element side is composed of a material of a high thermal conductivity in accordance with the present invention.
Figure 8C:
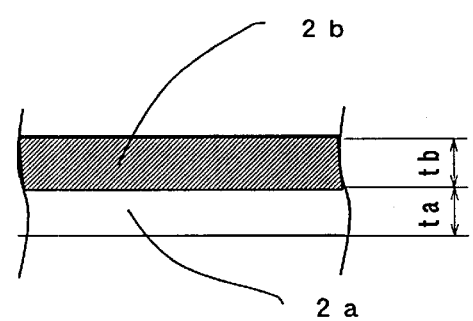
FIG. 8C shows an enlarged sectional view of the composite base comprising a plurality of materials, in which the face on the heat producing element side is composed of a material of a low thermal conductivity in accordance with the present invention.

FIGS. 8A, 8B and 8C, relate to a cooling apparatus with a composite base having a material of a high thermal conductivity near the heat producing element in accordance with. a fifth preferred embodiment of the present invention.

This embodiment is a modification of the third preferred embodiment, whereby base 2 is constructed by laminating two heat conducting plates 2a and 2b. In this embodiment, the thermal conductivity of the heat conducting plate 2b which is directly in contact with the heat producing element 3 is higher than that of the heat conducting plate 2a.

FIG. 8A shows a sectional view of the base comprising two different kinds of materials.

In FIG. 8B, the heat conducting plates 2a and 2b whose thickness is respectively ta and tb, are respectively disposed on the fin 1 side and the heat producing element 3 side. This construction is defined as the Type 1. The thermal conductivity of the heat conductive plates 2a and 2b is respectively $\lambda a$ and $\lambda b$, and $\lambda a$ is less than $\lambda b$.

In FIG. 8C, the construction of the materials of the base 2 is the other way around from the Type 1 with the heat conductive plate 2b being disposed on the fin 1 side and the heat conductive plate 2a on the heat producing element 3 side. This is the Type 2.

Figure 9:
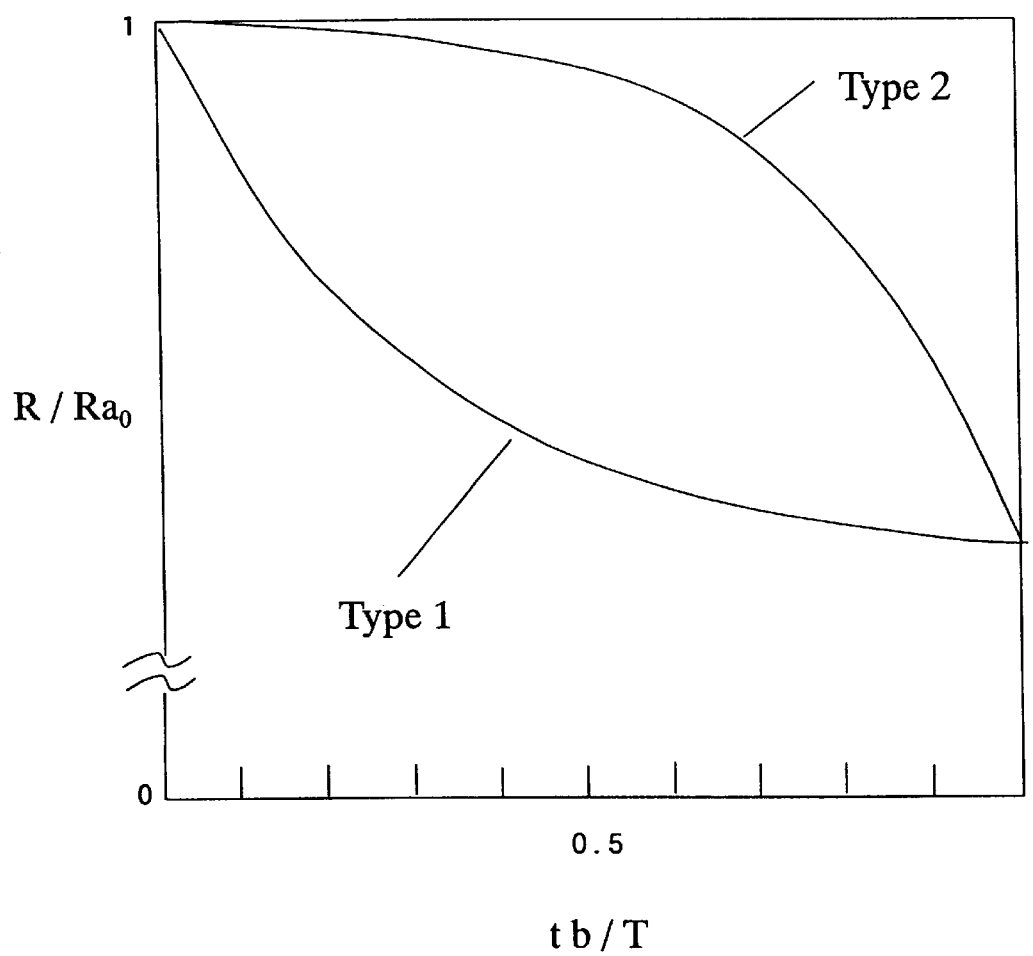
FIG. 9 is a graph showing a relationship between the composite base sections comprising a plurality of materials constructed in different ways (type 1 and type 2) and the ability of the heat sink.
Figure 10A:
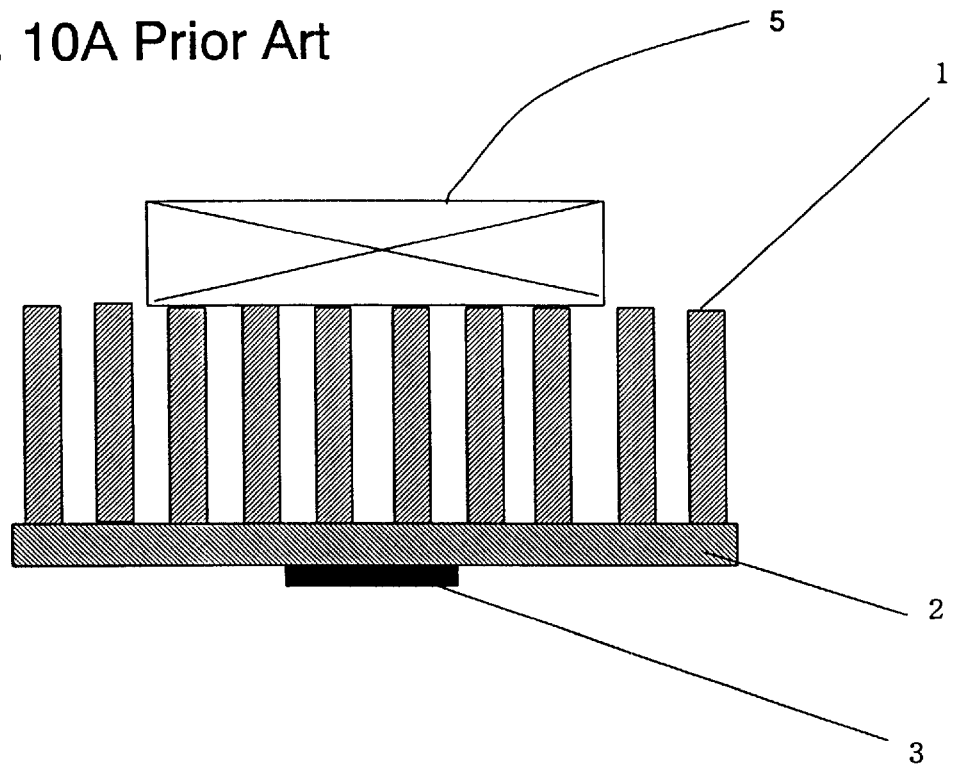
FIGS. 10A and 10B show schematic diagrams showing constructions of conventional cooling apparatuses.
Figure 10B:
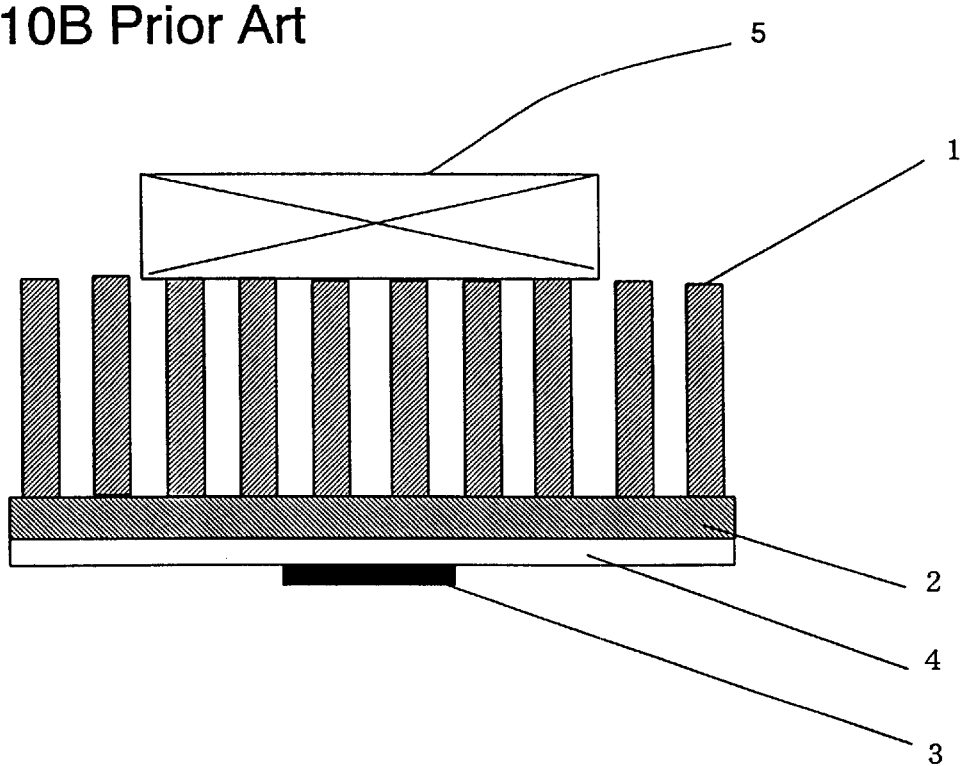
Figure 11A:
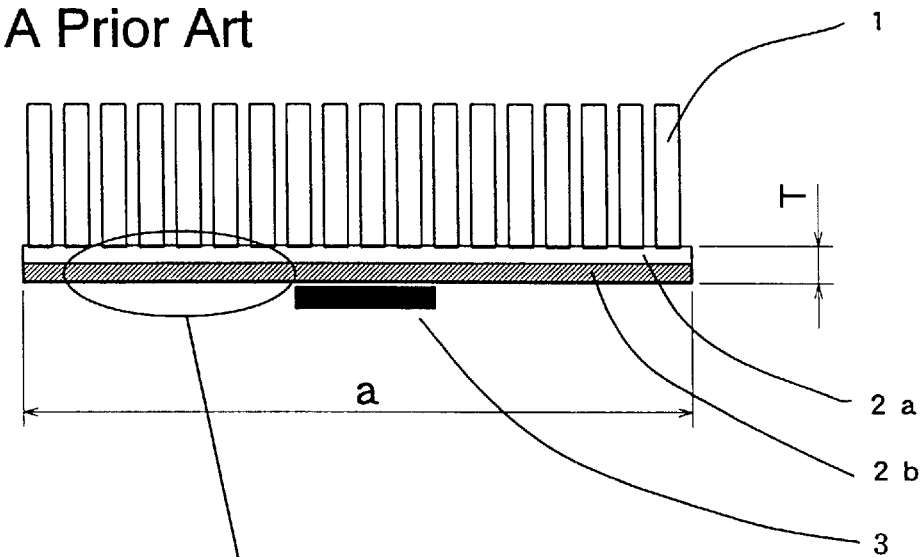
FIGS. 11A and 11B show schematic diagrams showing constructions of conventional cooling apparatuses having a composite base section.
Figure 11B:
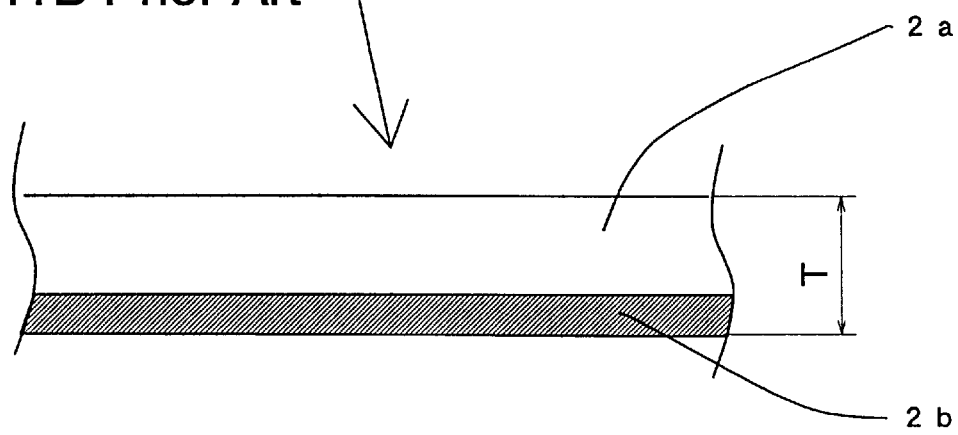

FIG. 9 is a graph showing the relationship between 1) the ratio of the sizes tb/T obtained by setting the total thickness of the base T (T=ta+tb) and changing the thickness tb of the heat conductive plate 2b, and 2) the normalized heat resistance R/Rao, observed with both Type 1 and Type 2. As FIG. 9 shows, in the case of the Type 1, the normalized heat resistance R/Rao steeply drops as the thickness tb of the heat conductive plate 2b increases. Conversely, in the case of the Type 2, up until the ratio of the sizes tb/T reaches about 0.5, the normalized heat resistance does not drop significantly. These results suggest that by using a material with high thermal conductivity near the heat producing element, in other words, by promoting the heat dissipation effect at the furthest location from the fins 1 within the base 2, heat can be conducted to the fins 1 over a broader area more easily, thereby improving the cooling ability.

The basic heat resistance Rao here is defined as the heat resistance obtained when T=ta, namely, the thickness of the heat conductive plate 2b, tb equals to 0 in FIG. 8b. The normalized heat resistance R/Rao is calculated such that the heat resistance R, which is a value obtained by setting the total thickness of the base T (T=ta+tb) constant and changing the thickness tb of the heat conducting plate 2b, is divided by Rao to normalize.

The effect brought about when dissipating heat near the heat producing element 3 in order to reduce the heat resistance, can be applied to the heat sinks in which the base 2 is composed of two or more materials.

As thus far described, by selecting most appropriate materials and sizes for the base section for the heatsink used for the cooling apparatuses, the maximum cooling ability can be obtained for the same volume. In other words, the smallest and lightest cooling apparatus can be obtained for the same ability.

In this embodiment, the heat conductive plates 2a and 2b are constructed with metallic plates, however, the heat conductive plates can be made with block-type, sheet-type or thin-film materials. The thin film can be formed by spattering or firing. When one of the heat conductive plates 2a and 2b is formed with thin film or sheet, it is preferably formed on the face in direct contact with the heat producing element 3. The reason for this is that if the heat conductive plate 2a, on which the fins 1 are disposed, is a plate or block type, the fins 1 can be firmly fixed to the heat conductive plate 2a.

When a fan is mounted onto the heat sink, it is mounted on the top of the heat sink, namely, on the face with the fins 1. The fan is fixed onto the heat sink with screws or adhesives. The fan sucks up gases from the surrounding environment and blows them onto the heat sink, or conversely, sucks up gases from the heat sink side to exhaust them to outside. The gases here include not only air but also any other gases existing around the fan. For example, if nitrogen or inert gases exist in the environment surrounding the fan, the gases mentioned before include these gases.

Adopting a fan allows a forced cooling in addition to the natural heat dissipation through the heat sink, thereby further improving the cooling effect.

The fan comprises a frame, a driving means such as a motor, a impeller which is rotated by the driving means, and a circuit board which drives the driving means. It is possible to dispose the circuit board outside and not include it in the fan. By mounting a fluid bearing on the motor, the vibration of the motor and associated noise generated during the rotation of the fan can be reduced, thereby restricting damage or breakdown of the connection between the heat producing element 3 and a circuit board 13.

So far the description is given on the case in which the fan is mounted on the top face of the heat sink. However, the fan can be mounted any of the four sides of the heat sink. Alternatively, the fan can be prepared independently outside of the heat sink to provide air circulation to the heat sink. In this embodiment, only one fan is used, however, by using a plurality of fans, the cooling effect can be further improved. Examples of such constructions include: 1) two or more fans on the top face of the heat sink; 2) fans on the top face and a side face; 3) fans on the side walls facing each other; and 4) a fan on the top face or a side face, and a stand-alone fan outside of the heat sink.

Some of the fins 1 can be cut short according to the size of the fan to dispose the fan in the recess so as to lower the excess height of the fan protruding from the surface of the heat sink. This construction will contribute to downsizing. In this case, the fan is surrounded by the fins 1. The fan is not necessarily totally surrounded by the fins 1, it can be imbedded in the heat sink in such a manner that two side faces of the fan and the fins 1 face each other.

In this embodiment, as a forced cooling means, a fan is used, however, other kind of fans such as a cross-flow fan, or a cooling means constructed with a pipe and a motor which circulates refrigerant such as water in the pipe in contact with the heat sink may be used.

Although the present invention has been fully described by way of examples with reference to the accompanying drawings, it is to be noted that various changes and modifications will be apparent to those skilled in the art. Therefore, unless such changes and/or modifications depart from the scope of the present invention as defined by the appended claims, they should be construed as being included therein.

What is claimed is:

1. A cooling element for semiconductor devices comprising:

a base section in contact with a heat producing element; and a heat dissipation section integrally formed with said base section, said heat dissipation section having a plurality of fins formed on a surface thereof, said fins having a shape selected from the group consisting of a square pole, a cylinder, a polygonal pole and an elliptic cylinder, wherein a ratio of T/L is within a range of not less than 0.14 and not more than 0.24, where T is thickness of said base section, and L is one of a shortest width and an external diameter of said base section disposed right above said heat producing element, and corners of said base section and said heat dissipation section are chamfered.

2. A cooling apparatus for semiconductor devices comprising:

a) a base section in contact with a heat producing element;

b) a heat dissipation section integrally formed with said base section, said heat dissipation section having a plurality of fins formed on a surface thereof, said fins having a shape selected from the group consisting of a square pole, a cylinder, a polygonal pole and an elliptic cylinder; and c) a cooling fan disposed on said heat dissipation section, wherein a ratio of T/L is within a range of not less than 0.14 and not more than 0.24, where T is a thickness of said base section, and L is one of a shortest width and an external diameter of said base section disposed right above said heat producing element, and corners of said base section and said heat dissipation section are chamfered.

* * * * *